(12) United States Patent
Takamuku

(10) Patent No.: US 7,183,806 B2
(45) Date of Patent: Feb. 27, 2007

(54) OUTPUT CIRCUIT

(75) Inventor: Yayoi Takamuku, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 163 days.

(21) Appl. No.: 11/078,622

(22) Filed: Mar. 14, 2005

(65) Prior Publication Data
US 2006/0082381 A1    Apr. 20, 2006

(30) Foreign Application Priority Data
Oct. 14, 2004   (JP) ............................. 2004-299547

(51) Int. Cl.
*H03K 19/0175* (2006.01)
(52) U.S. Cl. ............................ 326/90; 326/17; 326/18; 326/86
(58) Field of Classification Search ............ 326/17–18, 326/86, 89–90
See application file for complete search history.

(56) References Cited

U.S. PATENT DOCUMENTS 4,633,491 A * 12/1986 Kuhnel ..................... 377/20
6,377,480 B1 * 4/2002 Sase et al. ................... 363/49

FOREIGN PATENT DOCUMENTS

JP    2002-354714    12/2002

* cited by examiner

*Primary Examiner*—Anh Q. Tran
(74) *Attorney, Agent, or Firm*—Westerman, Hattori, Daniels & Adrian, LLP.

(57) ABSTRACT

Since voltages of two input terminals of an output unit having an online download function are decided by voltages which are not correlative to each other, a value of an incoming current on the start-up becomes large. The present invention solves the problem of turning-on of a parasitic transistor due to a transitional minus potential even when the voltage of the output unit on a stationary state is set to 0 V in order to reduce the incoming current. In this invention, a switch is turned on and off by a download switching digital signal, and an input from a delay circuit for charging and discharging a condenser in the delay circuit whose one end is connected to a reference potential is input to one of the input terminals of the output terminal while the reference potential is applied to the other input terminal of the output unit. Thus, an input error in the output unit is reduced to prevent an excessive incoming current. Therefore, it is possible to freely select the voltage on the stationary state of the output unit, thereby preventing the unwanted turning-on of the parasitic transistor.

4 Claims, 2 Drawing Sheets

OUTPUT CIRCUIT

BACKGROUND OF THE INVENTION

1. Field of the Invention

The present invention relates to an output circuit to be connected to a field-bus used for a transmitter or the like installed in a worksite, the output circuit outputting digital data created inside the transmitter connected to the field-bus.

2. Description of the Prior Art

Limit values of an incoming current and a slew rate are prescribed in a physical layer of a field-bus used for a transmitter or the like. Therefore, an output circuit which outputs data to the field-bus decides a time constant by way of a resistance and a condenser for each of cases of starting up and switching to download a software program or the like so as to comply with the prescriptions.

Shown in FIG. 1 is an output circuit for outputting data to such field-bus. Referring to FIG. 1, a digital signal Vx created inside a transmitter is input to one end of a resistance R1. A condenser C1 is connected between the resistance R1 and a common potential point. A delay circuit is configured by the resistance R1 and the condenser C1, and values of the resistance and the condenser are decided so as to satisfy the prescription of slew rate for download switching. A resistance R2 is connected between a connection point of the resistance R1 with the condenser C1 and a noninverting input terminal of an amplifier OP1, and a resistance R4 is connected between the noninverting input terminal and a reference voltage Va.

A condenser C2 is connected between an inverting input terminal and an output terminal of the amplifier OP1, and a resistance R3 is connected between the inverting input terminal and the common potential point. The output terminal of the amplifier OP1 is connected to a base of a transistor TR1, and an emitter of the transistor TR1 is connected to the field-bus via a resistance R5. More specifically, the emitter of the transistor TR1 is connected to the resistance R5 and the common potential point via a resistance (not shown) and the like. A voltage of one end of the resistance R5 connected to the field-bus is returned to the noninverting input terminal of the amplifier OP1 via a resistance R6.

With such constitution, an output from the amplifier OP1 is raised to increase a current flowing to the transistor TR1 when the digital signal Vx changes from a low level to a high level. A value of the current is detected by the resistance R5 to be fed back to the amplifier OP1. Thus, the digital signal Vx is output to the field-bus.

In order to satisfy the prescription for incoming current of the field-bus, it is necessary to minimize an input error of the amplifier OP1 on the start-up. Therefore, it is desirable that a voltage Vn of the inverting input terminal and a voltage Vp of the noninverting voltage are equal to each other or decided by a correlative voltage.

However, as can be seen from FIG. 1, since the voltage Vx and the reference voltage Va are connected to the noninverting input terminal, Vp is decided depending on the voltages. On the other hand, the inverting input terminal is connected to the common potential point. Accordingly, since there is no correlation between Vp and Vn, it is difficult to reduce the input error. Also, the input error can be increased by the condenser C1 on the start-up. Therefore, an input on a stationary state is set to 0 V.

The above-described output circuit has the following problems. The input of the amplifier OP1 becomes 0 V or less transitionally though it does not ideally. Since an ASIC (Application Specific Integrated Circuit) is ordinarily used as the amplifier OP1, a parasitic transistor is turned on by the transitional voltage of 0 V or less to cause erroneous operation.

Further, unexpected operation is undesirably caused when the digital signal Vx is connected to an output circuit performing analog operation.

SUMMARY OF THE INVENTION

An object of the present invention is to provide an output circuit capable of freely selecting an input potential of an amplifier and of separating a digital signal from a circuit performing analog operation.

In order to attain the object, an output circuit according to a first aspect of the invention comprises: a charge circuit to which a switch element turned on and off by a digital signal and a constant current unit are serially connected; a delay circuit including a condenser charged by the charge circuit and a resistance parallelly connected to the condenser, one end of the parallel circuit of the condenser and the resistance being connected to a reference potential; and an output unit having input terminals and outputting a current relating to an output from the delay circuit to a bus, the output from the delay circuit being input to one of the input terminals and the reference potential being input to the other input terminal via a resistance. Thus, it is possible to prevent the incoming current caused by the output unit.

An output circuit according to a second aspect of the invention is according to the first aspect, wherein a buffer is inserted between the delay circuit and the output unit. Thus, the output circuit is not influenced by an output impedance of the delay circuit.

An output circuit according to a third aspect of the invention is according to the first or second aspect and characterized in that the bus is a foundation field-bus or a profi-bus. The effects of the invention are particularly remarkable when the invention is applied to the foundation field-bus or the profi-bus in which an incoming current and a slew rate are prescribed.

DETAILED DESCRIPTION OF THE PREFERRED EMBODIMENTS

Figure 1:
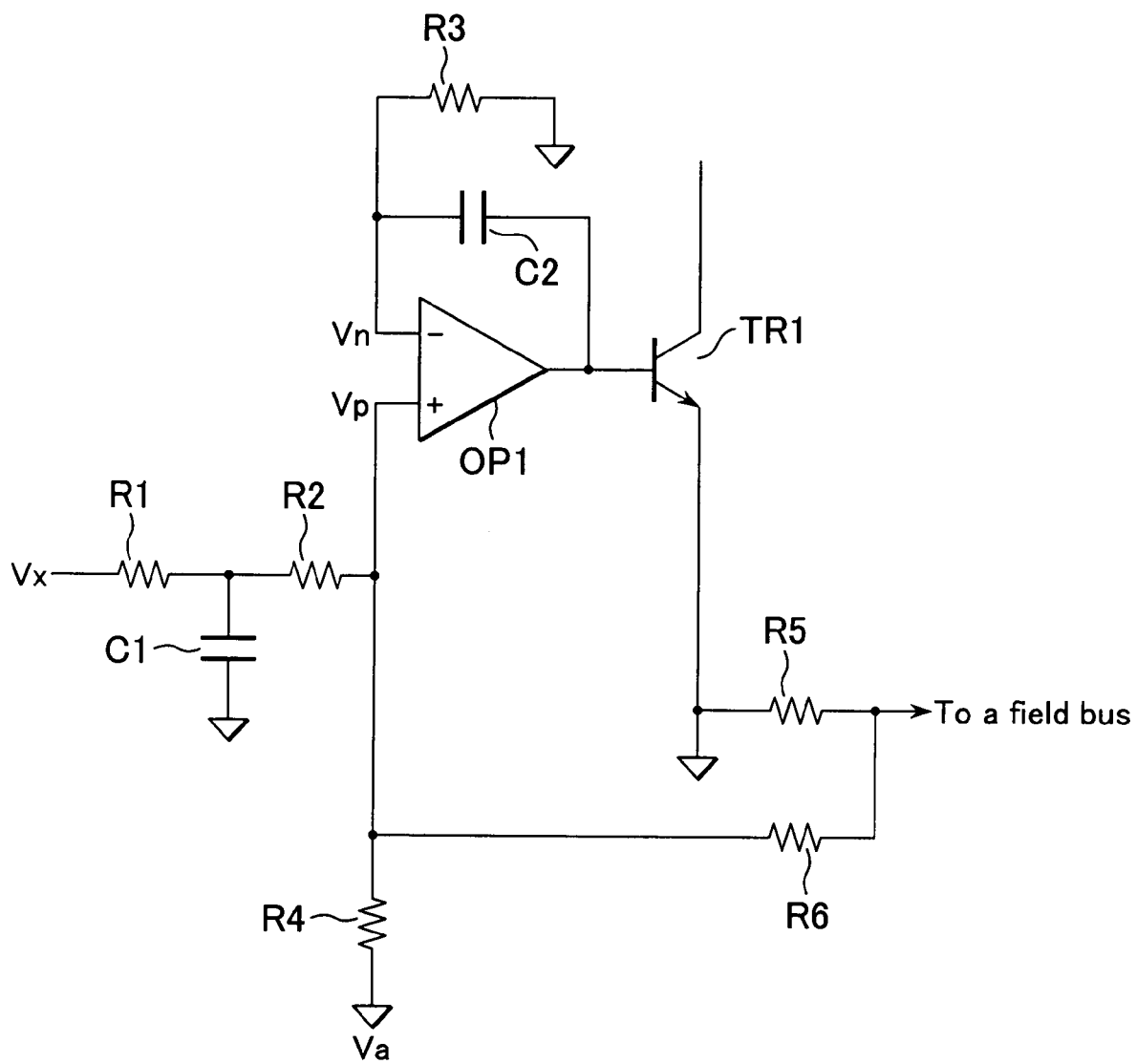
FIG. 1 is a block diagram showing a conventional output circuit.
Figure 2:
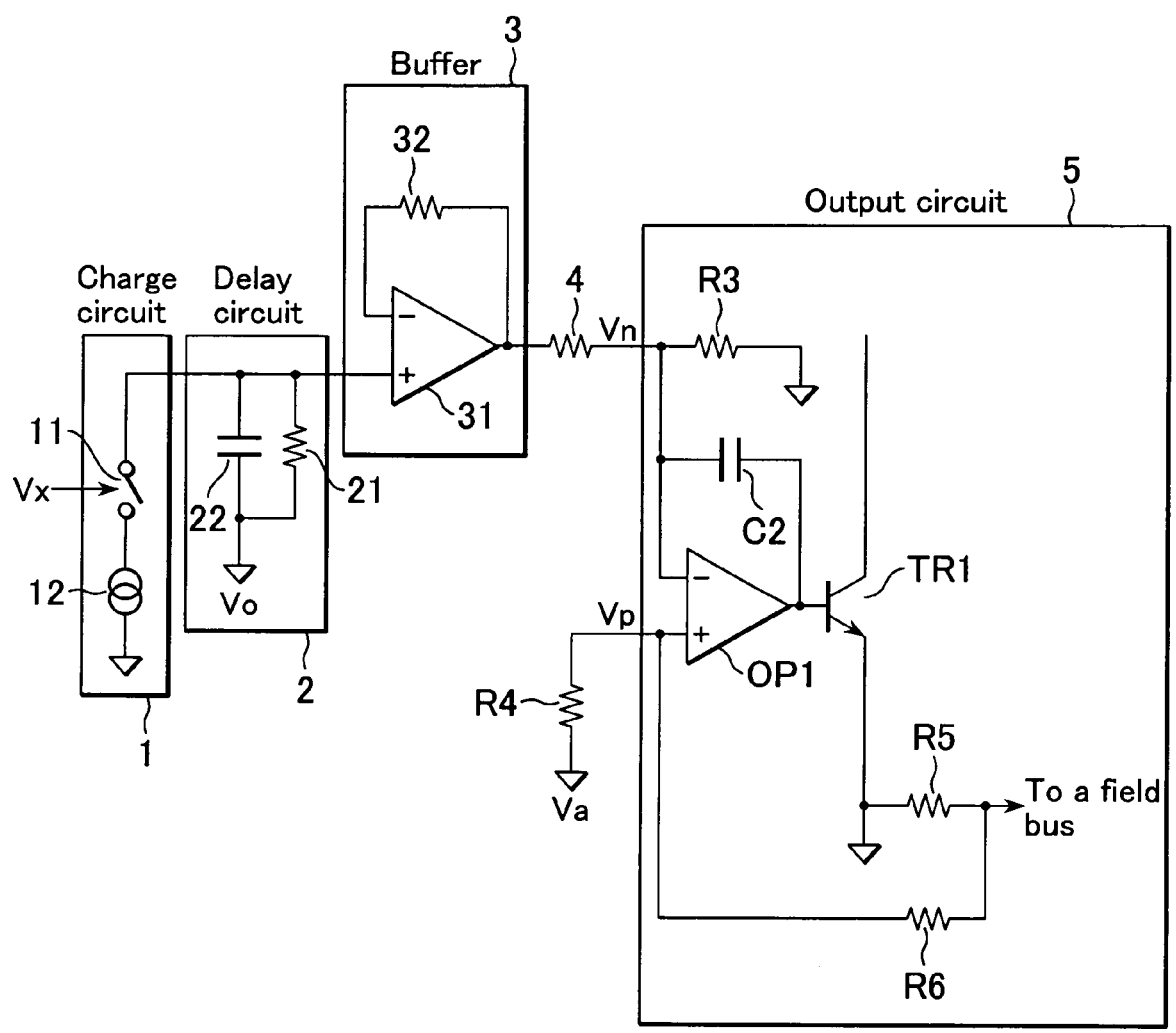
FIG. 2 is a block diagram showing one embodiment of the present invention.

The present invention will hereinafter be described in detail with reference to the drawings. FIG. 2 is a block diagram showing one embodiment of an output circuit according to the invention. In FIG. 2, elements identical with those shown in FIG. 1 are denoted by the same reference numerals to omit the descriptions thereof. Referring to FIG. 2, a switch 11 and a constant current source 12 are serially connected to a charge circuit 1. On/off of the switch 11 is controlled by a digital signal Vx. One end of the constant current source 12 to which the switch 11 is not connected is connected to a common potential point.

A resistance 21 and a condenser 22 are parallelly connected to a delay circuit 2. One end of the parallel circuit is connected to the switch 11, and the other end is connected to a reference potential point Va. A buffer 3 has an amplifier 31 and a resistance 32. One end of the resistance 32 is connected to an inverting input terminal of the amplifier 31 and the other end of the resistance 32 is connected to an output terminal of the amplifier 31. A common connection point of the switch 11 and the delay circuit 2 is connected to the noninverting input terminal of the amplifier 31.

An output unit 5 is connected to the buffer 3 via a resistance 4. The output unit 5 is substantially the same as the output circuit of FIG. 1 except that the output circuit includes the resistances R1, R2, R4, and the condenser C1. More specifically, the amplifier OP1 controls a transistor TR1 to output a current to a field-bus. A value of the output current is detected by a resistance R5 so that the detected value is returned to the amplifier OP1.

An inverting input terminal of the output unit 5 is denoted by Vn, and a noninverting input terminal of the output unit 5 is denoted by Vp. The inverting input terminal Vn and the noninverting input terminal Vp are used also as the inverting input terminal and the noninverting input terminal of the amplifier OP1. The resistance R4 is connected between the noninverting input terminal Vp and the reference potential point Va. An output from the buffer 3 is input to the inverting input terminal Vn of the output unit 5 via the resistance 4.

With such constitution, the condenser 22 is charged to a predetermined voltage when the switch 11 is turned on. An output from the delay circuit 2 is input to the output unit 5 via the buffer 3 and the resistance 4. The output unit 5 outputs a current corresponding to the input voltage to the field-bus. When the switch 11 is turned off, the charge of the condenser 22 is discharged by a resistance 21 so that a voltage of each of ends of the condenser 22 becomes 0 V. That is, potentials of the ends of the condenser 22 become equal to each other. The output unit 5 outputs a current corresponding to the voltage to the field-bus.

The condenser 22 is charged by the constant current source 12 and discharged by the resistance 21. Therefore, a slew rate of an output voltage of the delay circuit 2 is decided depending on an output current value of the constant current source 12, the condenser 22, and the resistance 21. It is possible to satisfy prescriptions of a foundation field-bus or a slew rate of profi-bus by adjusting these values.

The digital signal Vx is used only for turning on and off the switch 11 and is not connected to other circuits. Since a digital input to the ASIC and an analog input to the ASIC are separated from each other, the digital signal Vx is never connected to the output unit 5 which is constituted of analog components.

In this embodiment, the switch 11 is turned off on the start-up. Therefore, the output from the delay circuit 2 becomes the reference potential Va, and a potential of the inverting input terminal Vn of the output unit 5 becomes a voltage obtainable by dividing Va by the resistance. Also, the noninverting input terminal Vp becomes a voltage dividing Va by the resistance. Accordingly, an input error in the amplifier OP1 is reduced to prevent a large incoming current which is the cause of an input error in the field-bus from flowing to the field-bus on the start-up.

As described above, since the switch 11 is turned off and the condenser is perfectly discharged on the start-up, no voltage is generated on the ends of the condenser 22 on the start-up. Therefore, the incoming current, which is otherwise caused by the condenser 22, does not flow to the field-bus on the start-up.

Thus, the digital signal Vx is separated from the output unit 5, and the incoming current which is otherwise caused due to the input error of the amplifier OP1 or the condenser 22 does not flow to the field-bus. Therefore, it is possible to freely select an input potential of the amplifier OP1, thereby making it possible to prevent the turning-on of the parasitic transistor which is otherwise caused by the transitional voltage. Further, the digital signal Vx and the condenser C1 will not exert adverse influences on the incoming current.

As is apparent from the foregoing description, this invention has the following effects.

According to the first, second and third aspects of the invention, the digital signal turns the switch on and off to charge the condenser in the delay circuit of which one end is connected to the reference potential, and the output from the delay circuit is input to one of the input terminals of the output unit to be converted into the current value while the reference potential is applied to the other input terminal of the output unit.

With such constitution, since the two input terminal voltages of the output unit are decided by the same reference potential, the invention achieves effects of reducing the incoming current flowing to the bus and freely selecting the input potential of the output unit.

Also, the digital signal Vx only controls the switch and is not connected to the analog circuit. Further, the condenser is perfectly discharged on the start-up. Therefore, the invention achieves an effect of eliminating the adverse influences of the digital signal Vx and the condenser C1 otherwise exerted on the incoming current and the slew rate on the start-up.

This invention is particularly suitable for an output circuit of a foundation field-bus or a profi-bus which must comply with prescriptions thereof such as a slew rate and an incoming current on the start-up.

What is claimed is:

1. An output circuit, comprising:
   a charge circuit to which a switch element turned on and off by a digital signal and a constant current unit are serially connected;
   a delay circuit including a condenser charged by the charge circuit and a resistance parallelly connected to the condenser, one end of the parallel circuit of the condenser and the resistance being connected to a reference potential; and
   an output unit having input terminals and outputting a current relating to an output from the delay circuit to a bus, the output from the delay circuit being input to one of the input terminals and the reference potential being input to the other input terminal via a resistance.

2. The output circuit according to claim 1, wherein a buffer is inserted between the delay circuit and the output unit.

3. The output circuit according to claim 2, wherein the bus is a foundation field-bus or a profi-bus.

4. The output circuit according to claim 1, wherein the bus is a foundation field-bus or a profi-bus.

* * * * *